Jan. 27, 1970 R. D. HAUN, JR 3,492,072
APPARATUS FOR PRODUCING RADIATION PATTERNS FOR FORMING ETCHANT-RESISTANT PATTERNS AND THE LIKE
Filed April 14, 1965
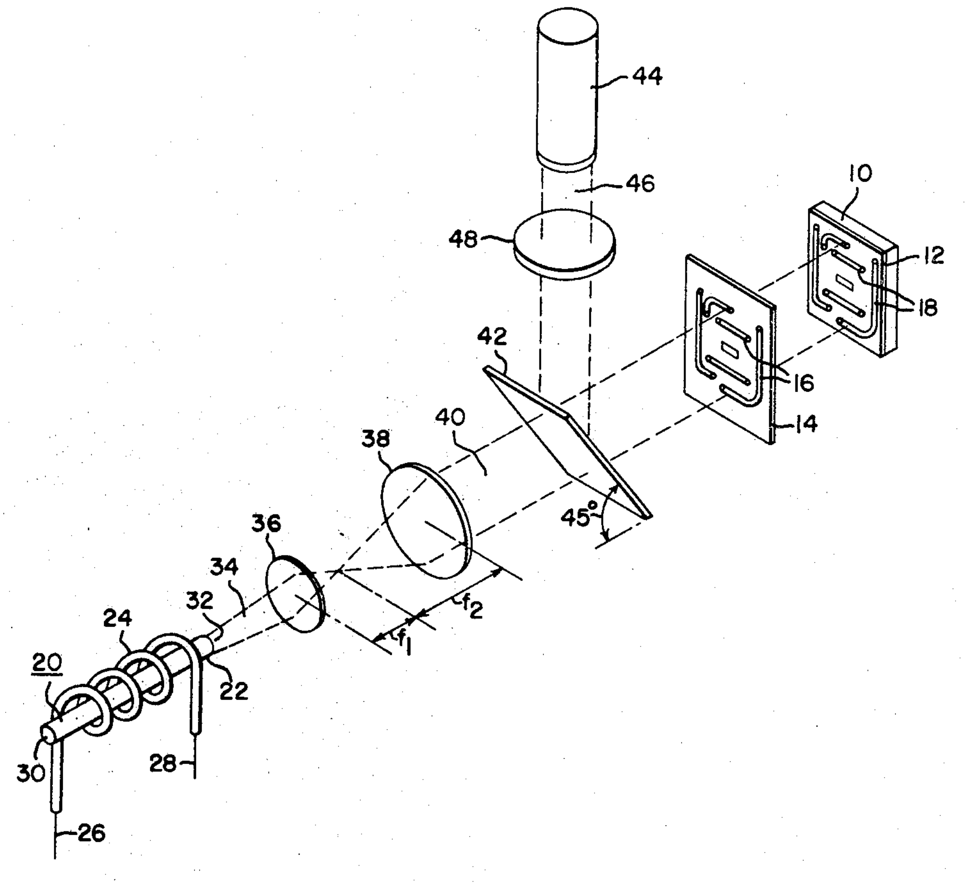
WITNESSES:
John L. Clopp
Leon M. Garman
INVENTOR
Robert D. Haun, Jr.
BY Gordon H. Telfer
ATTORNEY

United States Patent Office 3,492,072 Patented Jan. 27, 1970

3,492,072

APPARATUS FOR PRODUCING RADIATION PATTERNS FOR FORMING ETCHANT-RESISTANT PATTERNS AND THE LIKE

Robert D. Haun, Jr., Monroeville, Pa., assignor to Westinghouse Electric Corporation, Pittsburgh, Pa., a corporation of Pennsylvania Filed Apr. 14, 1965, Ser. No. 448,128
Int. Cl. G03b *27/02;* G01d *15/10;* H01s *3/00*
U.S. Cl. 355—78 5 Claims

ABSTRACT OF THE DISCLOSURE

A device for forming etchant-resistant patterns on the photosensitive layer of a workpiece including a laser source, a masking member, optical elements disposed between the laser source and the workpiece, and an auxiliary source of light for positioning the workpiece relative to the masking member. The laser source, masking member, optical elements, and workpiece are all positioned along the same optical axis while the auxiliary light source is positioned at a right angle with respect to the optical axis. A partially reflecting mirror is positioned along the optical axis and reflects the light emitted by the auxiliary light source through the masking member onto the workpiece to thereby enable the workpiece to be properly positioned before it is exposed to the laser source. After the workpiece is positioned, the laser source is activated to produce an etchant-resistant pattern thereon.

This invention relates to a method and apparatus for illuminating a substrate with a sharp pattern of radiation. More particularly, the invention relates to a method and apparatus for producing an etchant-resistant pattern on a substrate by photographic techniques.

While the description herein will be principally directed to the forming of an etchant-resistant pattern on a semiconductor body other applications including other substrates such as to form optical masks or printed circuits are also within the scope of the invention. Furthermore, in its broader aspects, the invention may be employed to form a pattern of any wavelength collimated radiation to impinge any substrate.

In the manufacture of semiconductor integrated circuits, a wafer of silicon is first oxidized to form a thin film of silicon dioxide on its surfaces. As is known, such an oxide film will permit gallium diffusion to proceed, but behaves as a very efficient barrier to diffusion of boron, phosphorus, arsenic or antimony. Advantage is taken of this fact to provide a method for preparing localized diffused regions in the semiconductor body to form an integrated circuit.

The technique is to cover the oxidized wafer with an organic material or photo-resist layer which polymerizes when subjected to ultraviolet radiation to form a coherent mass. Usually, the unexposed photo-resist material is applied in solution, the solvent is allowed to evaporate, and thereafter the material is exposed to ultraviolet light passing through light-transmitting areas of an optical mask. In this process, the pattern defined by the light-transmitting areas of the mask becomes polymerized. Washing of the coated wafer in a suitable solvent removes all but the polymerized area of the photosensitive layer exposed to light. The remaining areas, still covered by the polymer, protect the silica film during the next process, which is immersion of the wafer in a slow etch, usually consisting of a mixture of hydrofluoric acid and ammonium fluoride. The etch thus removes the silica film from all but the areas covered by the polymer. Finally, the remaining polymer is removed with a suitable solvent such as hot sulfuric acid, and the wafer is washed and dried preparatory to a succeeding diffusion process with boron, phosphorus, arsenic or antimony.

The usual method for polymerizing the coating on the wafer is to expose the material through a mask with a sun lamp adapted to produce the necessary ultraviolet radiation. This technique, however, is unsatisfactory for very precise work because the lamp is far from being a point source and, consequently, does not yield highly collimated radiation. That is, the ultraviolet rays emitted by the sun lamp are not parallel but rather diverge to a great degree and cannot readily be made parallel by lenses without substantial loss of intensity. When these rays pass through the light-transmitting areas of the mask which is spaced from the photo-resist layer on the silicon wafer, a certain amount of distortion in the polymerized pattern produced on the wafer will inherently result.

As one object, the present invention seeks to provide a method and apparatus for forming a sharp radiation pattern suitable for exposing photo-resist materials in which a very high degree of resolution can be achieved between the pattern-defining mask through which ultraviolet radiation passes and the photo-resist pattern produced on a silicon wafer or the like.

More specifically, an object of the invention is to provide a method for producing a photo-resist pattern with the use of a beam of coherent ultraviolet radiation produced by stimulated emission of radiation.

Still another object of the invention is to provide apparatus employing a laser device as a source of ultraviolet radiation for producing a photo-resist pattern on semiconductor wafers, and incorporating means employing an auxiliary light source free of ultraviolet radiation for visually indexing the wafer with respect to the light pattern produced by the aforesaid mask.

In accordance with the invention, coherent ultraviolet radiation produced by a laser is collimated by a pair of converging lenses. The collimated beam is thereafter passed through light-transmitting areas of a mask onto a substrate such as photosensitive material on the surface of a semiconductive wafer. The areas of the photosensitive material thus exposed to the ultraviolet radiation are chemically altered to produce an etchant-resistant pattern having an extremely high degree of resolution. The fact that the laser beam is already nearly collimated upon emission from the laser material permits its collimation while maintaining substantial intensity.

Preferably, an auxiliary source of light, having ultraviolet wavelengths filtered therefrom, is employer to initially index the wafer with respect to the light pattern produced by he aforesaid mask. This is achieved by placing a partially-reflecting mirror, disposed at an angle of 45° with respect to the incident ultraviolet radiation, between the laser device and the mask. The auxiliary source of light, having ultraviolet wavelengths filtered therefrom, is directed onto the partially-reflecting mirror at an angle of 90° with respect to the incident ultraviolet radiation. In this manner, before the ultraviolet radiation is passed through the mask, the auxiliary light source may be employed to visually observe the pattern produced by the mask on the wafer. Therefore, the wafer may be properly aligned with the visual pattern produced by the mask with the auxiliary light source such that when the auxiliary light source is extinguished and the ultraviolet beam produced, the etchant-resistant pattern will be properly positioned on the wafer.

The above and other objects and features of the invention will become apparent from the following discussion taken with the accompanying drawing wherein the single figure schematically illustrates one embodiment of the invention.

Referring now to the drawing, a silicon wafer 10 is shown on which an oxide film has been produced. On one face of the wafer 10 is a layer 12 of a photo-resist material which becomes polymerized when exposed to light to form an etchant-resistant coherent mass; however, if desired, the entire wafer may be coated with the photo-resist. In front of the silicon wafer 10 is an optical mask 14 having light-transmitting portions or openings 16 therein which define a pattern of etchant-resistant areas 18 to be produced in the coating 12. Such photo-resists which polymerize when exposed to ultraviolet radiation are well known in the art and need not be described herein in detail.

As was mentioned above, the wafer 10 is initially coated with the organic material 12 in liquid form (i.e., dissolved in a volatile solvent) and the solvent allowed to evaporate. Thereafter, ultraviolet light is passed through the light-transmitting areas 16 of mask 14 onto the coating 12. In this process, the area 18 defined by the light-transmitting areas 16 of mask 14 become polymerized. Subsequent washing of the wafer 10 in a suitable solvent for the material removes all but the area of the pattern 18. Consequently, the wafer 10 may now be etched to remove the silicon dioxide layer from all but the areas defined by pattern 18 preparatory to a subsequent diffusion operation.

In accordance with the present invention, the ultraviolet light which passes through the light-transmitting areas 16 and onto the coating 12 is produced by means of a laser, generally indicated by the reference numeral 20. As is well known, a laser operates on the principle of stimulated emission of wave energy in materials. Classically, the phenomenon can be summarized as related to the pumping of electrons to an excited energy state above their normal or ground energy level. Thus, an ion, atom or molecule in a material may exist in different energy states and the energy levels of these states may be raised by an external wave energy field which is pumped into the material. After the ions, atoms or molecules are raised to an excited state above their normal or ground level, they may revert back to the ground level, whereupon the energy absorbed in the pumping process is liberated; and, in the passage of such liberated energy quanta through the laser material, an orientation and accretion of such energy occurs until it is emitted as a coherent beam of specific wavelength. Thus, the light beam emitted by the laser is monochromatic or of specific wavelength and, because of its coherency, diverges to a very small degree.

In order to produce the necessary ultraviolet radiation, a glass rod 22 doped with the rare earth element gadolinium may be employed in the laser 20. The characteristics of such a laser are described, for example, in an article by H. W. Gandy and R. J. Ginther entitled "Stimulated Emission of Ultraviolet Radiation from Gadolinium-Activated Glass" appearing on pages 25–27 of Applied Physics Letters, volume 1, Number 1, Sept. 1, 1962. Other types of lasers are available capable of emitting ultraviolet radiation. For example, a nitrogen gas laser having output wavelength between 3000 and 4000 A., the strongest at 3371 A., is described in an article by H. G. Heard appearing at page 667 of the Nov. 16 1963 issue of Nature. Somewhat similar lasers employing mercury-argon gas or nitrogen gas are described by H. G. Heard and J. Peterson, Proc. IEEE 52, 1049 (1964) and by R. A. McFarlane, Appl. Phys. Let. 5, 91 (1964).

It should be understood, however, that the invention is not limited to any particular type of laser, or even to an ultraviolet-emitting laser, the essential feature being the production of a coherent beam of collimated radiation capable of exposing a photo-resist patern. For example, optical harmonic generation can be used to produce coherent ultraviolet radiation having the same collimation properties as the laser output used to produce the harmonics. Efficiencies as high as twenty percent have been achieved for conversion of the 6940 A. output of a ruby laser to its 3740 A. second harmonic (R. W. Terhune et al., Appl. Phys. Let. 2, 54 (1963).

In the particular example given herein, the rod 22 is surrounded by a helical flashtube 24, preferably filled with xenon, and having leads 26 and 28 adapted for connection to a source of pulsed potential. When the leads 26 and 28 are thus conected to a source of pulsed potential, the xenon within the helical tube 24 will emit ultraviolet pumping radiation which raises the energy levels of the gadolinium ions within the glass rod 22 in the manner described above. When the ions revert back to their ground level, the absorbed energy is liberated in the form of light. One end 30 of the rod is totally reflecting, while the other end 32 is partially reflecting only. Thus, by pumping light energies into the rod 22 by means of the flashtube 24, a steady oscillation of a single ultraviolet wavelength will be built up between the reflecting ends 30 and 32 of the rod 22; and since the end 32 is only partially reflecting, a portion of the amplified energy will pass therethrough as a beam 34 of ultraviolet wave energy.

Since the output aperture of the laser 20 defined by the area of the partially reflecting end 32 is relatively small, it is desirable to employ two converging lenses 36 and 38 in order to increase the diameter of the beam. By choosing the focal length $f_2$ of lens 38 to be longer than the focal length $f_1$ of lens 36, the diameter of the laser output beam is magnified by a factor equal to $f_2/f_1$, while the angular spread of the resulting beam 40 will be smaller by a factor of $f_1/f_2$. The beam 40 is collimated, meaning that the rays of light are parallel. Beam 40 is passed through a partially reflecting mirror 42 disposed at an angle of 45° with respect thereto. Thereafter, it passes through the light-transmitting areas 16 of the mask 14 and onto the coating 12 in the manner described above.

It is, of course, necessary to initially index the wafer 10 with respect to the mask 14 such that the etchant-resistant areas 18 will be properly positioned thereon. This is particularly true in cases where successive etching procedures are carried out on the same wafer. For this purpose, the partially reflecting mirror 42 is employed in conjunction with an auxiliary light source 44. As shown, the light source 44 is adapted to produce a beam of light 46 disposed at an angle of 90° with respect to the beam 40. This beam of light is passed through a filter 48 to eliminate all ultraviolet components. Thereafter, it is partially reflected from the upper surface of mirror 42 and passes through the light-transmitting areas 16 of mask 14 onto the wafer 10. The light thus directed onto the coating 12, being free of ultraviolet components, will not polymerize the monomer coating 12. At the same time, however, it provides a means whereby the pattern to be subsequently produced on the coating 12 may be visually observed and the wafer 10 adjusted such that the pattern will be correctly positioned thereon. While preferable, it is not essential that the light from source 44 be well collimated. A laser emissive of visible radiation is advantageous for the source 44 so that precise pattern positioning can be achieved.

Although the invention has been shown in connection with a certain specific embodiment, it will be readily apparent to those skilled in the art that various changes in form, method steps and arrangement of parts may be made to suit requirements without departing from the spirit and scope of the invention.

What is claimed is:

1. Apparatus for producing an etchant-resistant pattern on an ultraviolet-sensitive coating deposited on a workpiece, comprising a mask positioned in front of the coated workpiece and having light-transmitting areas therein defining the etchant-resistant pattern to be produced in the coating, a laser device arranged to produce a beam of coherent ultraviolet radiation, means for directing said beam of radiation through the mask and onto the coated workpiece, a partially reflecting mirror disposed between the laser device and the mask at an angle with respect to incident ultraviolet radiation, and an auxiliary source of visible light arranged to direct a visible light beam onto the mirror where it is partially reflected through the mask and onto the coated workpiece, the arrangement being such that the workpiece may be initially positioned to properly index the etchant-resistant pattern thereon by observing the visual pattern produced by the auxiliary light source before the ultraviolet radiation is generated by the laser to produce an etchant-resistant pattern.

2. The apparatus of claim 1 and including a filter in the light beam produced by the auxiliary light source for eliminating ultraviolet wavelengths.

3. The apparatus of claim 1 wherein the partially reflecting mirror is disposed at an angle of 45 degrees with respect to the beam of ultraviolet radiation, the auxiliary light source is disposed at an angle of 90 degrees with respect to the beam of ultraviolet radiation, and the means for directing the beam of ultraviolet radiation through the mask comprises a pair of converging lenses.

4. The apparatus of claim 1 wherein said auxiliary source of visible light comprises a laser emissive of visible radiation.

5. The apparatus of claim 1 wherein said workpiece is a semiconductor body having a layer of material thereon on which said pattern is desired.

References Cited

UNITED STATES PATENTS

| | | | |
|---|---|---|---|
| 3,096,767 | 7/1963 | Gresser et al. | 331—94.5 XR |
| 3,369,101 | 2/1968 | Di Curcio | 219—121 |
| 3,245,794 | 4/1966 | Conley. | |
| 3,266,393 | 8/1966 | Chitayat | 95—1.1 |

NORTON ANSHER, Primary Examiner

FRED L. BRAUN, Assistant Examiner

U.S. Cl. X.R.

331—94.5; 346—76